United States Patent [19]

Tajima

[11] Patent Number: 5,729,995
[45] Date of Patent: Mar. 24, 1998

[54] ELECTRONIC COMPONENT COOLING UNIT

[75] Inventor: Makoto Tajima, Tokyo, Japan

[73] Assignee: Calsonic Corporation, Tokyo, Japan

[21] Appl. No.: 617,557

[22] Filed: Mar. 19, 1996

[30] Foreign Application Priority Data

Mar. 20, 1995 [JP] Japan .................. 7-061306

[51] Int. Cl.⁶ .................................. F25D 23/12
[52] U.S. Cl. ................... 62/259.2; 165/104.33; 165/173; 165/104.21; 165/80.2; 361/689; 361/698; 361/700; 361/702
[58] Field of Search .............. 62/3.2, 3.3, 3.6, 62/3.7, 259.1, 259.2, 428; 165/104.33, 104.21, 172, 173, 80.2, 80.4; 361/687, 688, 689, 699, 700, 702, 709

[56] References Cited

U.S. PATENT DOCUMENTS

| | | | |
|---|---|---|---|
| 1,693,324 | 11/1928 | Stephens | 165/104.33 |
| 2,958,021 | 10/1960 | Cornelison et al. | 165/104.33 X |
| 4,204,246 | 5/1980 | Arii et al. | 165/103.33 |
| 4,293,030 | 10/1981 | Rambach | 165/104.33 X |
| 4,549,603 | 10/1985 | Shirai et al. | 165/104.33 |
| 4,633,371 | 12/1986 | Nagy et al. | 361/385 |
| 4,830,100 | 5/1989 | Kato et al. | 165/104.33 |
| 4,833,567 | 5/1989 | Saaski et al. | 361/385 |
| 4,912,548 | 3/1990 | Shanker et al. | 357/82 |
| 5,168,919 | 12/1992 | Berenholz et al. | 165/104.33 X |
| 5,216,580 | 6/1993 | Davidson et al. | 165/104.33 X |
| 5,252,778 | 10/1993 | Ogawa | 165/104.33 X |
| 5,305,184 | 4/1994 | Andresen et al. | 165/104.33 X |
| 5,323,292 | 6/1994 | Brzezinski | 165/104.33 X |
| 5,331,510 | 7/1994 | Ouchi et al. | 361/702 |
| 5,396,947 | 3/1995 | Itoh | 165/104.14 |
| 5,529,115 | 6/1996 | Paterson | 165/104.33 |

FOREIGN PATENT DOCUMENTS

| | | | |
|---|---|---|---|
| 1266244 | 5/1961 | France | 165/104.33 |
| 21441 | 2/1978 | Japan | 165/104.33 |
| 131755 | 8/1983 | Japan | 165/104.33 |
| 589631 | 1/1978 | U.S.S.R. | 165/104.33 |

Primary Examiner—John M. Sollecito
Attorney, Agent, or Firm—Sughrue, Mion, Zinn, Macpeak & Seas, PLLC

[57] ABSTRACT

In an electronic component cooling unit, parts of the outer surfaces of a plurality of passageways in which refrigerant flows are coupled to one surface of a cold plate on the other surface of which an electronic component is mounted, and a header tank is provided in the plurality of passageways so that a plurality of looped passageways are formed. The plurality of passageways are provided by a multi-flow-path container which is formed by extrusion molding and has a flattened cross section.

8 Claims, 3 Drawing Sheets

ELECTRONIC COMPONENT COOLING UNIT

BACKGROUND OF THE INVENTION

The present invention relates to an electronic component cooling unit which is to cool an electronic component such as a rectifier diode which generates heat.

A heat sink for cooling an electronic component such as a rectifier diode which generates heat has been disclosed, for instance, by Japanese Utility Model Unexamined Publication No. Sho. 55-75198.

The heat sink is as shown in FIG. 5. In the heat sink, an electronic component 13 such as a rectifier diode is fixedly mounted on one side of a mounting member 11, on the other side of which a plurality of heat radiating plates 17 is mounted (hereinafter referred to as "radiating plates 17", when applicable).

Corrugated radiating fins 19 (hereinafter referred to merely as "radiating fins 19", when applicable) are arranged between the heat radiating plates 17.

In the heat sink, the heat generated by the electronic component 13 is transmitted through the mounting member 11 and the radiating plates 17 to the radiating fins 19, and then radiated into the outside air through the radiating fins 19. Hence, the electronic component 13 is effectively cooled.

However, the conventional heat sink designed as described above suffer from the following difficulties: The electronic component 13 is cooled by natural heat radiation with the aid of the radiating plates 17 and the corrugated radiating fins 19. Hence, the sink is low in cooling efficiency.

In addition, the sink suffers from a problem in the case where the electronic component 13 is bulky; that is, it is large in the amount of heat radiation. In this case, it is necessary to increase the length of the radiating plates 17. However, as the radiating plates 17 are elongated, the efficiency with which the radiating plates 17 transmits heat to the radiating fins is lowered as much as the thermal conductivity. Hence, even if the number of radiating fins 19 is increased to increase the heat radiating area, the cooling power is not increased so much. This means that it is difficult to more effectively radiate the heat from the electronic component 13.

SUMMARY OF THE INVENTION

Accordingly, an object of the invention is to eliminate the above-described difficulties accompanying a conventional electronic component cooling unit. More specifically, an object of the invention is to provide an electronic component cooling unit which is much higher in electronic component cooling efficiency than a conventional one.

In an electronic component cooling unit according to a first aspect of the invention, portions of the outer surfaces of a plurality of passageways are coupled to one surface of a cold plate on the other surface of which an electronic component is mounted, and a header tank is provided in the plurality of passageways to form looped passageways. A refrigerant is contained in the looped passageways, and a pressure in the looped passageways is lower than an atmospheric pressure.

An electronic component cooling unit according to a second aspect of the invention is such that, in the unit of the second aspect, the header tank is provided in the lower portions of the looped passageways.

An electronic component cooling unit according to a third aspect of the invention is such that, in the unit of the first or second aspect, the plurality of passageways are provided by a multi-flow-path container which is formed by extrusion molding and has a flattened cross section.

In the electronic component cooling unit of the first aspect, the heat generated by the electronic component mounted on the one surface of the cold plate is transmitted through the cold plate to the plurality of passageways which are coupled to the other surface of the cold plate.

The heat thus transmitted evaporates the refrigerant in the coupling portions of the passageways. Thereafter, while the refrigerant thus evaporated flows in the passageways, performs heat exchange with the outside air, so that it is cooled and condensed. That is, the refrigerant, after being liquified, is led into the header tank.

In the electronic component cooling unit of the second aspect, the header tank is provided in the lower portions of the looped passageways. Hence, the refrigerant, after being positively liquified, is led into the header tank.

In the electronic component cooling unit of the third aspect, the plurality of passageways are provided by the multi-flow-path container which is formed by extrusion molding. Hence, a number of passageways can be formed with ease.

DETAILED DESCRIPTION OF THE PREFERRED EMBODIMENTS

The invention will now be described with reference to preferred embodiments shown in the accompanying drawings.

Figure 1:
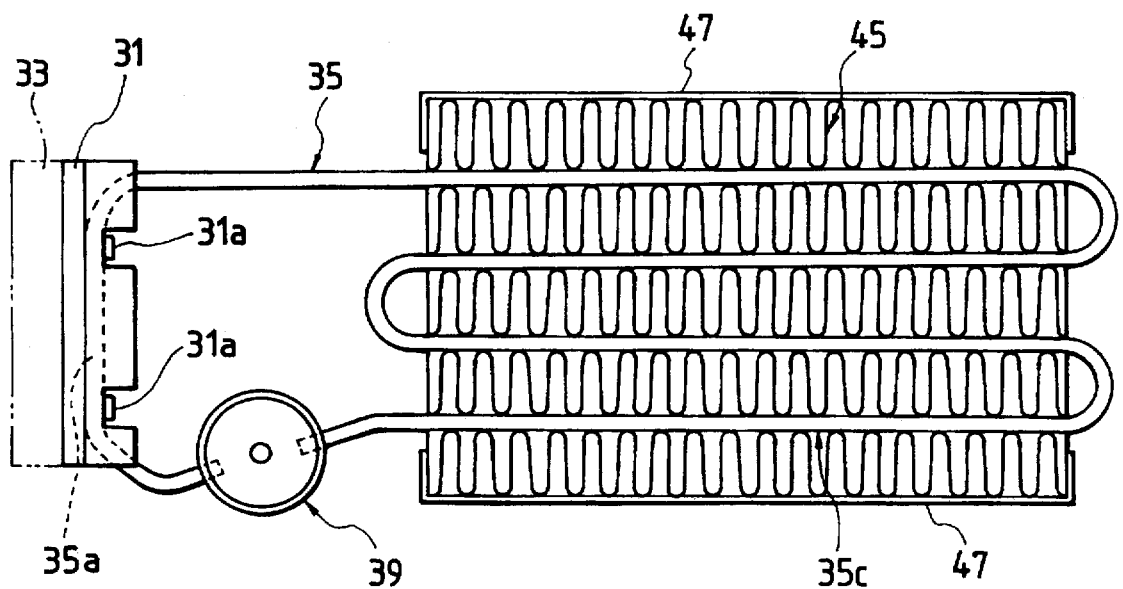
FIG. 1 is a side view showing an electronic component cooling unit according to an embodiment of the invention.
Figure 2:
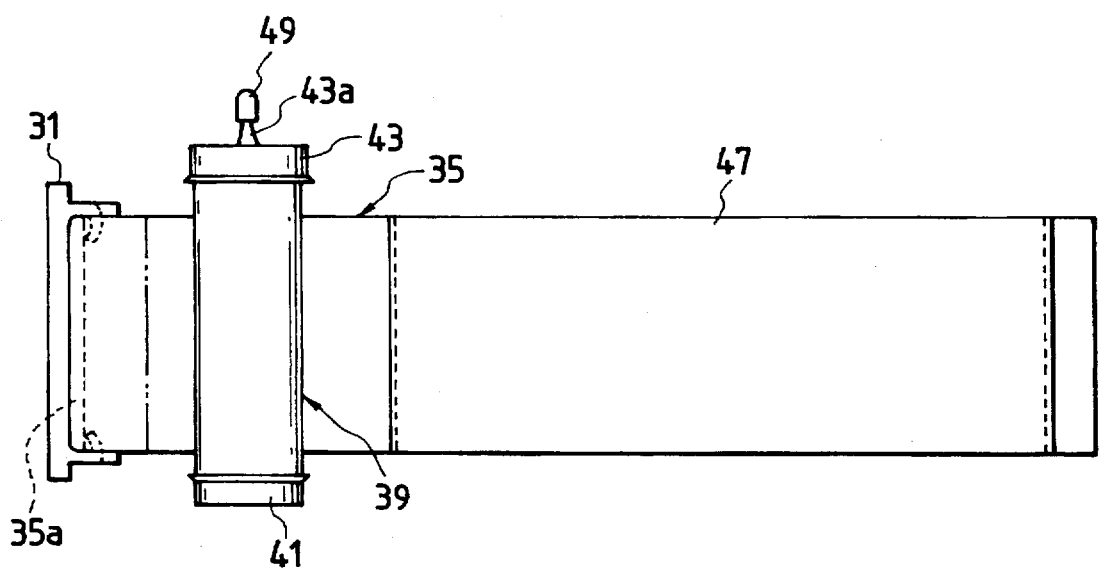
FIG. 2 is a bottom view of the electronic component cooling unit shown in FIG. 1.
Figure 3:
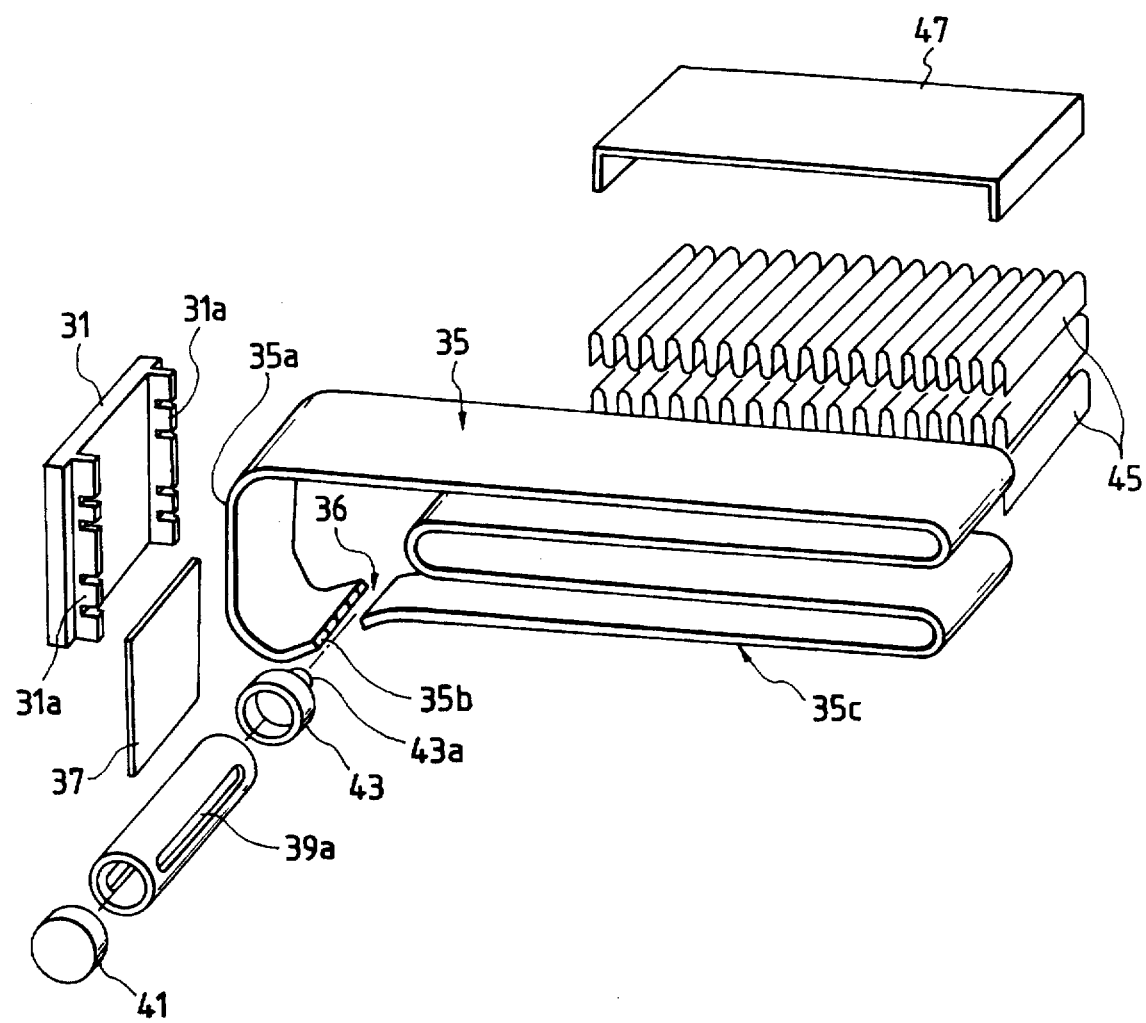
FIG. 3 is an exploded perspective view of the electronic component cooling unit shown in FIG. 1.

FIGS. 1 through 3 shows an electronic component cooling unit, which constitutes an embodiment of the invention. In those figures, reference numeral 31 designates a rectangular cold plate.

The cold plate 31 is made of a metal material such as aluminum high in thermal conductivity.

One surface of the cold plate 31 is provided for an electronic component. More specifically, an electronic component 33 such as an LSI or a multi-chip module (MCM) formed by integrating LSIs is bonded through an adhesive agent high in thermal conductivity onto the one surface of the cold plate 31.

The other (opposite) surface of the cold plate 31 is coupled through a brazing plate 37 to a coupling portion 35a which is a part of a multi-flow-path container 35.

The brazing plate 37 has brazing material layers on both sides thereof.

The cold plate 31 has caulking pawls 31a.

The multi-flow-path container 35 is made of a metal material such as aluminum high in thermal conductivity.

The container 35 is formed by extrusion molding in such a manner that it has a flattened cross section and it provides a plurality of passageways 35b arranged at predetermined intervals in the direction of width thereof.

The container 35 is bent perpendicular to the coupling portion 35a, and then bent alternately in U-shape, thus forming a heat exchanger section 35c.

Both ends of the container 35 are located below the body of the container 35, and a header tank 39 is interposed between the two ends of the container 35 so that a plurality of looped passageways 36 are formed.

The header tank 39 is made of a metal material such as aluminum high in thermal conductivity.

The header tank 39 has a pair of elongated holes 39a, in which both end portions of the container 35 are fitted.

Patch ends 41 and 43 are fitted in both ends of the header tank 39.

Heat radiating fins 45 made up of corrugated fins are arranged in the heat exchanger section 35c of the container 35.

The radiating fins 45 are also made of a metal material such as aluminum high in thermal conductivity.

The electronic component cooling unit further comprises end plates 47, which are arranged in such a manner as to cover the outermost radiating fins 45.

The electronic component cooling unit thus constructed is assembled as follows: First, the radiating fins 45 and the end plates 47 are joined to the multi-flow-path container 35, and then both end portions of the container 35 are fitted in the elongated fitting holes 39a of the header tank 39, and the patch ends 41 and 43 are engaged with both ends of the header tank 39. Thereafter, the coupling portion 35a of the container 35 is positioned through the brazing plate 37 on the cold plate 31, and the caulking pawls 31a are bent to couple the cold plate to the coupling portion 35a.

Thereafter, those parts thus temporarily joined together are subjected to brazing in a brazing oven, thus positively joined together into one unit.

The patch end 43 of the header tank 39 has a refrigerant pouring inlet 43a. A predetermined quantity of refrigerant such as water is poured into the header tank 39 through the inlet 43a. Thereafter, air is removed from the header tank 39 and the container 35 to a pressure of about $10^{-5}$ Torr through the refrigerant pouring inlet 43a, and the inlet 43a is sealed with a sealing member 49.

With the electronic component cooling unit thus constructed, the heat generated by the electronic component 33 mounted on the one surface of the cold plate 31 is transmitted through the cold plate 31 to the multi-flow-path container 35 which is coupled to the other surface of the cold plate 31.

By the heat thus transmitted, the refrigerant such as water is evaporated, which is located in the passageways 35b corresponding to the coupling portion 35a of the container 35. Thereafter, while flowing through the heat exchanger section 35c of the passageways 35b, the refrigerant performs heat-exchange with the outside air through the radiating fins 45, thus being cooled and condensed. That is, the refrigerant, after being liquified, is led into the header tank 39.

In the thus constructed electronic component cooling unit, the heat generated by the electronic component 33 is transmitted through the cold plate 31 to the plurality of looped passageways 36, and by this transmitted heat, the refrigerant in the coupling portion 35a of the plurality of looped passageways 36, is evaporated. Thereafter, while flowing through the plurality of looped passageways 36, the refrigerant performs heat-exchange with the outside air, thus being cooled and condensed. That is, the refrigerant, after being liquified, is led into the header tank 39. Hence, the electronic component cooling unit is much higher in electronic component cooling efficiency than the conventional one.

That is, in the above-described electronic component cooling unit, the latent heat of the refrigerant is utilized to lead the heat generated by the electronic component 33 to the heat exchanger section 35c. Hence, the heat generated by the electronic component can be led to the heat exchanger section 35c with high efficiency. Hence, the electronic component cooling unit of the invention is much higher in electronic component cooling efficiency than the conventional one.

Accordingly, when compared with the conventional heat sink which utilizes natural heat radiation to cool the electronic component, a great amount of heat can be radiated with the cooling unit of the invention.

In the above-described electronic component cooling unit, the radiating fins 45 are arranged in the heat exchanger section 35c of the container 35, and therefore the heat exchange effectiveness of the heat with respect to the outside air is markedly improved.

The multi-flow-path container has a plurality of looped passageways 36; that is, a number of looped passageways can be obtained readily and positively. The looped passageways thus obtained are high both in air-tightness and in reliability.

Furthermore, in the above-described electronic component cooling unit, the header tank 39 is coupled to the lower portion of the looped passageways. Hence, the refrigerant liquified at the heat exchanger section 35c is positively led into the header tank 39.

The plurality of passageways 35b are communicated with one another through the header tank 39 so that the looped passageways 36 are formed. Hence, the refrigerant pouring inlet 43a formed in the patch end 43 of the header 39 may be utilized positively to pour the refrigerant into the passageways and to remove air therefrom.

Moreover, in the above-described electronic component cooling unit, the refrigerant flows uniformly over the whole surface of the cold plate 31; that is, the latter has no heat spot, and therefore the electronic component 33 attached thereto can be positively protected.

Figure 4:
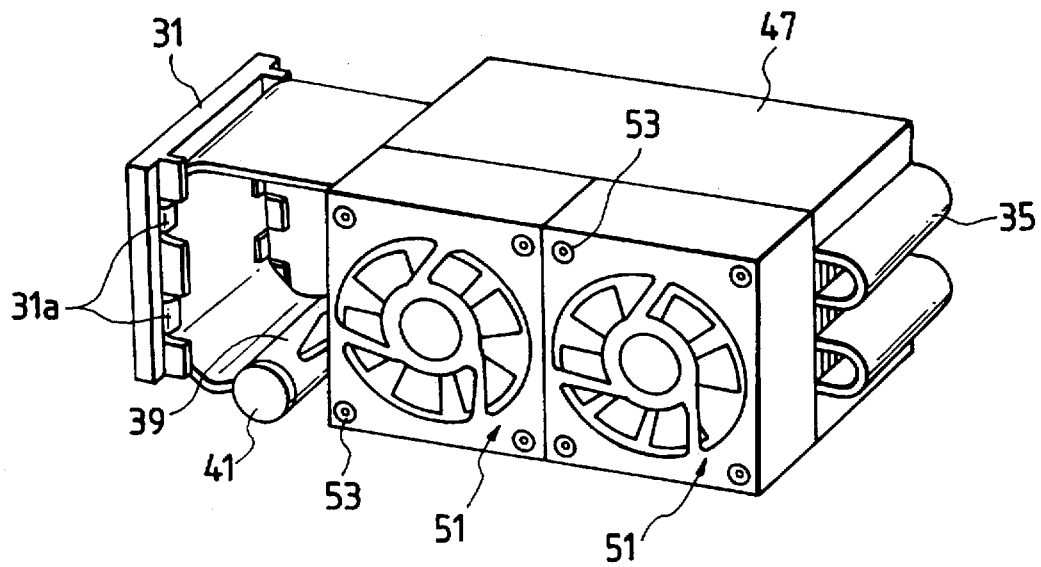
FIG. 4 is a perspective view of the electronic component cooling unit shown in FIG. 1 which is equipped with electric fans.
Figure 5:
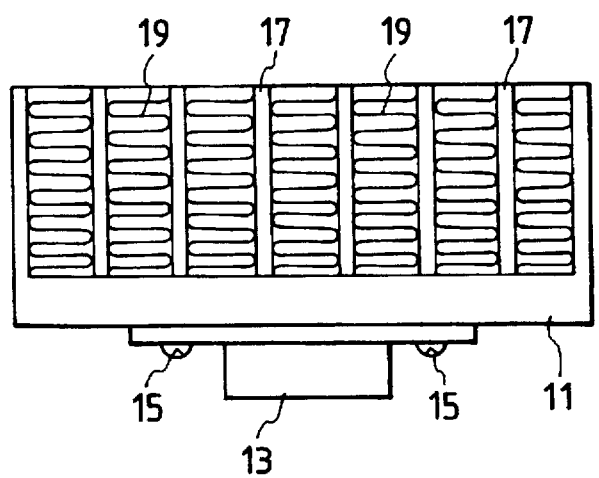
FIG. 5 is a side view of a conventional heat sink.

FIG. 4 shows the above-described electronic component cooling unit equipped with fans 51. More specifically, two fans 51 are installed on one side of the multi-flow-path container 35 with screws 53.

With the electronic component cooling unit, the air heated by the radiating fins 45 can be positively led out of the unit by the fans 51. This feature further improves the cooling unit in heat exchange efficiency.

In the above-described embodiment, the technical concept of the invention is applied to the protection of the electronic component 33 which is an MCM; however, the invention is not limited thereto or thereby. That is, it goes without saying that the invention is widely applicable to a variety of electronic elements which generate heat.

As was described above, in the electronic component cooling unit of the first aspect, the heat generated by the electronic component is transmitted through the cold plate to the passageways. The heat thus transmitted evaporates the refrigerant in the coupling portion of the passageways, and thereafter, while the refrigerant thus evaporated flow in the looped passageways, performs heat exchange with the outside air, so that it is cooled and condensed. That is, the refrigerant, after being liquified, is led into the header tank. Hence, the electronic component cooling unit of the invention is much higher in electronic component cooling efficiency than the conventional one.

In the electronic component cooling unit of the second aspect, the header tank is provided in the lower portions of the looped passageways. Hence, the refrigerant liquified at the heat exchange section can be positively led into the header tank.

In the electronic component cooling unit of the third aspect, the plurality of passageways are provided by the multi-flow-path container which is formed by extrusion molding. Hence, a number of passageways can be obtained with ease.

What is claimed is:

1. An electronic component cooling unit, comprising:

a cold plate, an electronic component being mounted on one surface of said cold plate;

a plurality of passageways through which a refrigerant flows, portions of outer surfaces of said plurality of passageways being coupled to the other surface of said cold plate; and a header tank provided in said plurality of passageways so that a plurality of looped passageways are formed, wherein said refrigerant is contained in said looped passageways, and a pressure in said looped passageways is lower than an atmospheric pressure wherein said plurality of passageways are provided by a multi-flow-path container which has a flattened cross section and which is matingly engaged with said cold plate, and wherein said cold plate further comprises caulking pawls bent to couple the cold plate to a coupling portion of said multi-flow-path container.

2. An electronic component cooling unit as claimed in claim 1, wherein said header tank is provided in the lower portions of said looped passageways.

3. An electronic component cooling unit as claimed in claim 1, wherein said multi-flow-path container is provided with a heat exchanger section bent at least once into U-shape.

4. An electronic component cooling unit as claimed in claim 3, further comprising a corrugated fin disposed at said heat exchanger section.

5. An electronic component cooling unit as claimed in claim 1, further comprising a brazing plate for coupling to the coupling portion of said multi-flow-path container and to said cold plate.

6. An electronic component cooling unit as claimed in claim 5, wherein said header tank has a pair of elongated holes in which the end portions of the multi-flow-path container are fitted.

7. An electronic component cooling unit as claimed in claim 6, further comprising end plates for covering the outermost of said radiating fins.

8. An electronic component cooling unit as claimed in claim 7, further comprising a refrigerant pouring inlet on said header tank.

* * * * *